United States Patent
Haq et al.

(10) Patent No.: US 8,481,859 B2
(45) Date of Patent: Jul. 9, 2013

(54) METHOD OF PREPARING A FLEXIBLE SUBSTRATE ASSEMBLY AND FLEXIBLE SUBSTRATE ASSEMBLY THEREFROM

(75) Inventors: Jesmin Haq, Tempe, AZ (US); Scott Ageno, Phoenix, AZ (US); Douglas E. Loy, Chandler, AZ (US); Shawn O'Rourke, Tempe, AZ (US); Robert Naujokaitis, Chandler, AZ (US)

(73) Assignee: Arizona Board of Regents, a body corporate of the State of Arizona, Acting for and on behalf of Arizona State University, Scottsdale, AZ (US)

( * ) Notice: Subject to any disclaimer, the term of this patent is extended or adjusted under 35 U.S.C. 154(b) by 60 days.

(21) Appl. No.: 13/118,225

(22) Filed: May 27, 2011

(65) Prior Publication Data

US 2011/0228492 A1     Sep. 22, 2011

Related U.S. Application Data

(63) Continuation of application No. PCT/US2009/066259, filed on Dec. 1, 2009.

(60) Provisional application No. 61/119,217, filed on Dec. 2, 2008, provisional application No. 61/182,464, filed on May 29, 2009, provisional application No. 61/230,051, filed on Jul. 30, 2009.

(51) Int. Cl.
*H05K 1/00* (2006.01)

(52) U.S. Cl.
USPC .......... 174/254; 257/678; 257/710; 428/40.1; 428/41.8; 428/86; 428/141; 428/212; 428/332; 428/354; 428/414; 156/71; 156/230; 156/235; 156/247; 156/327; 156/329; 430/271.1; 349/96; 349/187; 349/190

(58) Field of Classification Search
USPC .................. 174/254; 257/678, 701; 428/40.1, 428/41.8, 86, 141, 212, 332, 354, 414; 156/71, 156/230, 235, 247, 249, 327, 329; 430/271.1; 349/96, 187, 190
See application file for complete search history.

(56) References Cited

U.S. PATENT DOCUMENTS

| | | | | | |
|---|---|---|---|---|---|
| 3,089,801 | A | * | 5/1963 | Tierney et al. | ................. 428/332 |
| 3,684,637 | A | * | 8/1972 | Anderson et al. | ................. 28/86 |
| 4,337,107 | A | * | 6/1982 | Eshleman | ................. 156/249 |
| 4,349,593 | A | * | 9/1982 | Blechstein | ................. 428/41.1 |
| 4,858,073 | A | | 8/1989 | Gregory | |

(Continued)

FOREIGN PATENT DOCUMENTS

| | | |
|---|---|---|
| CN | 1118075 | 3/1996 |
| CN | 101231972 A | 7/2007 |

(Continued)

OTHER PUBLICATIONS

International Search Report from PCT/US09/66259, 10 pages. May 5, 2010.

*Primary Examiner* — Xiaoliang Chen

(74) *Attorney, Agent, or Firm* — Bryan Cave LLP

(57) ABSTRACT

Some embodiments teach a method of preparing a flexible substrate assembly. The method can include: (a) providing a carrier substrate; (b) providing a cross-linking adhesive; (c) providing a plastic substrate; and (d) coupling the carrier substrate to the plastic substrate using the cross-linking adhesive. Other embodiments are disclosed in this application.

21 Claims, 9 Drawing Sheets

U.S. PATENT DOCUMENTS

| | | | |
|---|---|---|---|
| 5,098,772 A * | 3/1992 | af Strom | 428/211.1 |
| 5,220,488 A | 6/1993 | Denes | |
| 5,229,882 A * | 7/1993 | Rowland | 359/530 |
| 5,264,063 A * | 11/1993 | Martin | 156/247 |
| 5,714,305 A * | 2/1998 | Teng et al. | 430/271.1 |
| 5,853,511 A * | 12/1998 | Fairbanks | 156/71 |
| 5,869,150 A | 2/1999 | Iwamoto | |
| 5,890,429 A * | 4/1999 | Alam et al. | 101/129 |
| 5,916,652 A * | 6/1999 | Miner et al. | 428/41.8 |
| 6,083,580 A * | 7/2000 | Finestone et al. | 428/34.2 |
| 6,177,163 B1 * | 1/2001 | Blok et al. | 428/40.1 |
| 6,482,288 B1 * | 11/2002 | Kreckel et al. | 156/247 |
| 6,627,037 B1 * | 9/2003 | Kurokawa et al. | 156/712 |
| 6,630,289 B1 * | 10/2003 | Kwok et al. | 430/321 |
| 6,808,773 B2 * | 10/2004 | Shimamura et al. | 428/40.1 |
| 7,212,088 B1 | 5/2007 | Norregaard | |
| 7,316,942 B2 | 1/2008 | Sarma et al. | |
| 7,906,193 B2 * | 3/2011 | Yukawa et al. | 428/41.8 |
| 8,048,251 B2 * | 11/2011 | Yamashita et al. | 156/235 |
| 2002/0008839 A1 * | 1/2002 | Miyai et al. | 349/190 |
| 2002/0018173 A1 * | 2/2002 | Furukawa et al. | 349/187 |
| 2003/0072889 A1 * | 4/2003 | Abrams | 427/458 |
| 2004/0008298 A1 * | 1/2004 | Kwok et al. | 349/96 |
| 2005/0242341 A1 | 11/2005 | Knudson et al. | |
| 2006/0017154 A1 * | 1/2006 | Eguchi et al. | 257/701 |
| 2006/0169485 A1 | 8/2006 | Kawaguchi et al. | |
| 2007/0241436 A1 * | 10/2007 | Ookubo et al. | 257/678 |
| 2008/0050548 A1 * | 2/2008 | Abrams | 428/41.8 |
| 2008/0179594 A1 | 7/2008 | Oh | |
| 2009/0004419 A1 * | 1/2009 | Cok et al. | 428/40.1 |
| 2009/0008132 A1 | 1/2009 | Takasawa et al. | |
| 2010/0003512 A1 * | 1/2010 | Ookubo et al. | 428/345 |
| 2010/0003513 A1 * | 1/2010 | Ookubo et al. | 428/345 |
| 2010/0038023 A1 * | 2/2010 | Kho et al. | 156/247 |
| 2010/0059171 A1 * | 3/2010 | Chun | 156/230 |
| 2011/0064953 A1 * | 3/2011 | O'Rourke et al. | 428/414 |

FOREIGN PATENT DOCUMENTS

| | | |
|---|---|---|
| JP | 2007146121 | 6/2007 |
| WO | 2007083906 A1 | 7/2007 |
| WO | 2008005979 A1 | 1/2008 |

* cited by examiner the Army Research Lab (ARL).
METHOD OF PREPARING A FLEXIBLE SUBSTRATE ASSEMBLY AND FLEXIBLE SUBSTRATE ASSEMBLY THEREFROM

CROSS-REFERENCE TO RELATED APPLICATIONS

This application is a continuation of PCT Application No. PCT/US2009/066259, filed Dec. 1, 2009, which claims the benefit of (a) U.S. Provisional Application No. 61/119,217, filed Dec. 2, 2008, (b) U.S. Provisional Application No. 61/182,464, filed May 29, 2009, and (c) U.S. Provisional Application No. 61/230,051, filed Jul. 30, 2009. PCT Application No. PCT/US2009/066259 and U.S. Provisional Application Nos. 61/119,217, 61/182,464, and 61/230,051 are incorporated herein by reference.

STATEMENT REGARDING FEDERALLY SPONSORED RESEARCH OR DEVELOPMENT

The U.S. Government has a paid-up license in this invention and the right in limited circumstances to require the patent owner to license to others on reasonable terms as provided by the terms of Grant/Contract No. W911NF-04-2-0005 by the Army Research Lab (ARL).

FIELD OF THE INVENTION

This invention relates generally to processing flexible substrate assemblies, and relates more particularly to a method of decreasing distortion of a flexible substrate and the flexible substrate assemblies therefrom.

DESCRIPTION OF THE BACKGROUND

In the electronics industry, flexible substrates are quickly becoming popular as a base for electronic circuits. Flexible substrates can include a wide variety of materials including, for example, any of a myriad of plastics. Once a desired electronic component, circuit, or circuits are formed over a surface of the flexible substrate, the flexible substrate can be attached to a final product or incorporated into a further structure. Typical examples of such products or structures are active matrices on flat panel displays, RFID (radio-frequency identification) tags on various commercial products in retail stores, a variety of sensors, etc.

One major problem that arises, however, is stabilizing the flexible substrate during processing. For example, in a process of fabricating a thin film, a thin film transistors (TFTs) or thin film transistor circuits (TFT circuits) on a flexible substrate, a large number of process steps are performed during which the flexible substrate may be moved through several machines, ovens, cleaning steps, etc. To move a flexible substrate through such a process, the flexible substrate is typically temporarily mounted to some type of carrier substrate so that the flexible substrate can be moved between process steps.

However, the relatively high coefficient of thermal expansion (CTE) for flexible substrates compared to typical carrier substrates leads to significant CTE induced strain mismatch during temperature excursions of the TFT or TFT circuit processing. This phenomenon introduces significant distortion of the flexible substrate and can lead to handling errors, photolithographic alignment errors, and line/layer defects.

Therefore, a need exists in the art to develop novel compositions and methodologies for coupling a flexible substrate to a carrier substrate to mediate the preceding limitations.

BRIEF DESCRIPTION OF THE DRAWINGS

To facilitate further description of the embodiments, the following drawings are provided in which.

Figure 1:
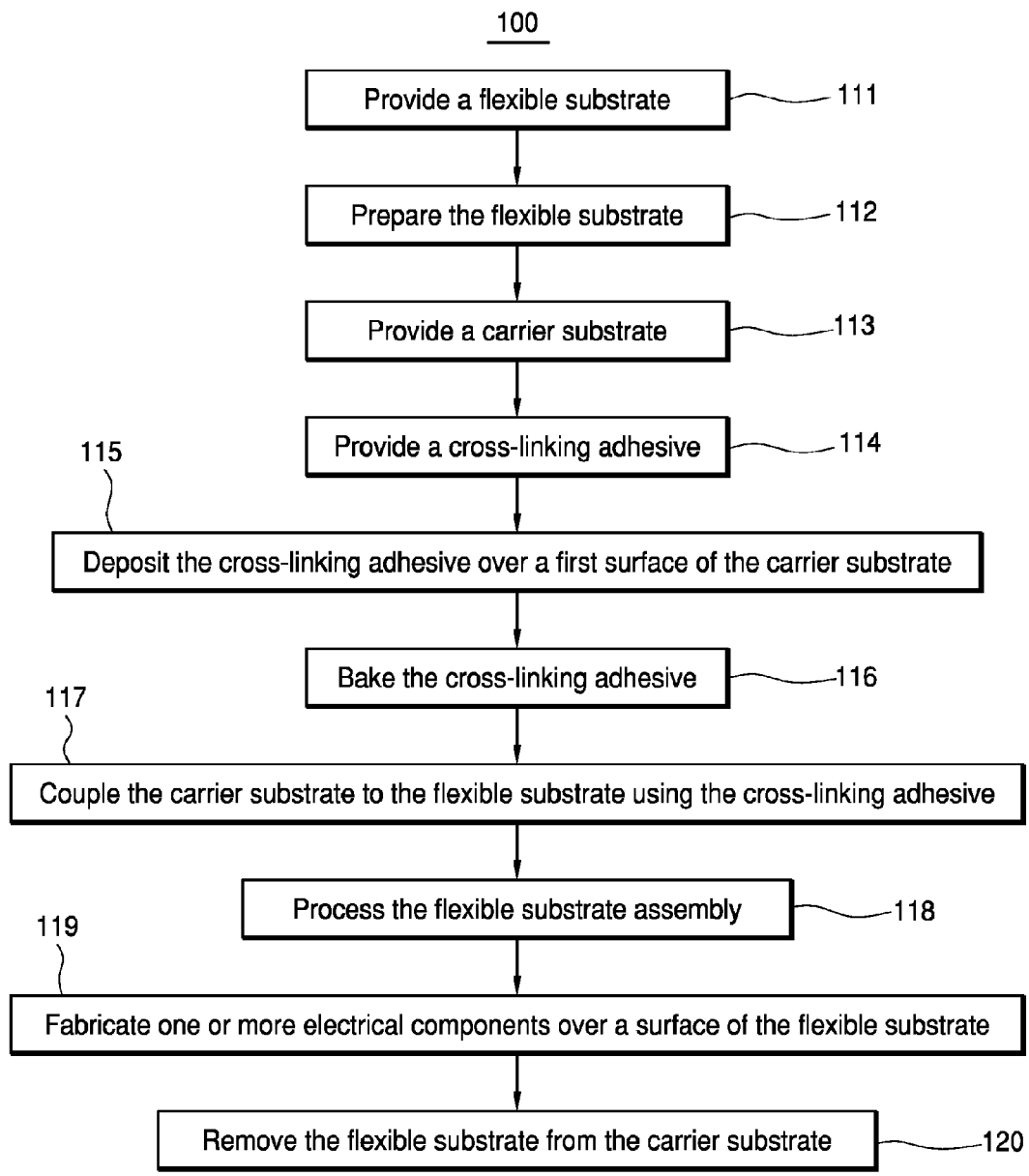
FIG. 1 illustrates a flow chart of a method of preparing a flexible substrate assembly, according to a first embodiment.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically, and/or otherwise. Two or more electrical elements may be electrically coupled, but not be mechanically coupled; two or more mechanical elements may be mechanically coupled but not be electrically coupled; two or more electrical elements may be mechanically coupled, but not be electrically coupled. Coupling (whether only mechanical, only electrical, etc.) may be for any length of time, e.g., permanent or semi-permanent or only for an instant.

The absence of the word "removably," "removable," and the like near the word "coupled," and the like does not mean that the coupling, etc. in question is or is not removable.

DETAILED DESCRIPTION OF EXAMPLES OF EMBODIMENTS

Some embodiments include a method of preparing a flexible substrate assembly.

The method can include: (a) providing a carrier substrate; (b) providing a cross-linking adhesive; (c) providing a plastic substrate; and (d) coupling the carrier substrate to the plastic substrate using the cross-linking adhesive.

In another embodiment, a flexible substrate assembly can include: (a) a carrier substrate with a first surface; (b) a cross-linking adhesive; and (c) a plastic substrate having a first surface and a second surface opposite the first surface. The first surface of the carrier substrate is removably bonded to the first surface of the plastic substrate with the cross-linking adhesive.

Other embodiments include a method of fabricating a semiconductor device over a flexible plastic substrate. This method can include: (a) providing a flexible plastic substrate having a first surface and a second surface opposite the first surface; (b) attaching a protective material to the first surface of the flexible plastic substrate; (c) providing a support substrate with a first surface and a polished second surface opposite the first surface; (d) providing a cross-linking acrylic adhesive; (e) spin-coating the cross-linking acrylic adhesive onto the first surface of the support substrate; (f) removably coupling the first surface of the support substrate to the second surface of the flexible plastic substrate using the cross-linking acrylic adhesive; and (g) laminating the support substrate and the flexible plastic substrate with the cross-linking acrylic adhesive between the support substrate and the flexible plastic substrate.

The term "bowing" as used herein means the curvature of a substrate about a median plane, which is parallel to the top and bottom sides, or major surfaces of the substrate. The term "warping" as used herein means the linear displacement of the surface of a substrate with respect to a z-axis, which is perpendicular to the top and bottom sides, or major surfaces of the substrate. The term "distortion" as used herein means the curvature or stress of a substrate in-plane (i.e., the x-y plane, which is parallel to the top and bottom sides, or major surfaces of the substrate). For example, distortion could include shrinkage in the x-y plane of a substrate and/or expansion in the x-y plane of the substrate.

The term "CTE matched material" as used herein means a material that has a coefficient of thermal expansion (CTE) which differs from the CTE of a reference material by less than about 20%. Preferably, the CTEs differ by less than about 10%, 5%, 3%, or 1%. As used herein, "polish" can mean to lap and polish a surface or to only lap the surface.

Turning to the drawings, FIG. 1 illustrates a method 100 for an embodiment of preparing a flexible substrate assembly, according to a first embodiment. In the same or different embodiment, method 100 or a portion thereof can be considered a method of fabricating a semiconductor device over a flexible plastic substrate. Method 100 is merely exemplary and is not limited to the embodiments presented herein. Method 100 can be employed in many different embodiments or examples not specifically depicted or described herein.

Method 100 includes a procedure 111 of providing a flexible substrate. The term "flexible substrate" as used herein means a free-standing substrate comprising a flexible material which readily adapts its shape. In some embodiments, procedure 111 can include providing a flexible substrate with a low elastic modulus. For example, a low elastic modulus can be considered an elastic modulus of less than approximately five GigaPascals (GPa).

In many examples, the flexible substrate is a plastic substrate. For example, flexible substrates can include polyethylene naphthalate (PEN), polyethylene terephthalate (PET), polyethersulfone (PES), polyimide, polycarbonate, cyclic olefin copolymer, or liquid crystal polymer.

In many examples, the flexible substrate can include a coating at one or more sides of the flexible substrate. The coating can improve the scratch resistance of the flexible substrate and/or help prevent outgassing, oligomer crystallization on the surface of the flexible substrate, and/or other leakage of chemicals from the flexible substrate. Moreover, the coating can planarize the side of the flexible substrate over which it is located. The coating also can help decrease distortion. In some examples, the coating is located only at the side of the flexible substrate where the electrical device will be fabricated. In other examples, the coating is at both sides of the flexible substrate. In various embodiments the flexible substrate can be provided pre-planarized. For example, the flexible substrate can be a PEN substrate from DuPont Teijin Films of Tokyo, Japan, sold under the tradename "planarized Teonex® Q65." In other embodiments, a flexible substrate can be planarized after being provided.

The thickness of the plastic substrate can be in the range of approximately 25 micrometers to approximately 300 micrometers. In the same or different embodiments, the thickness of the plastic substrate can be in the range of approximately 100 micrometers to approximately 200 micrometers.

In some examples, the flexible substrate can be provided by cutting a sheet of a plastic substrate from a roll of the plastic material using a paper cutter or a pair of ceramic scissors. In various examples, after cutting the plastic substrate, the cut sheet is blown clean with a nitrogen gun. In some embodiments of method 100, either or both of the cutting and blowing processes can be part of a procedure 112, described below, instead of being part of procedure 111.

Figure 2:
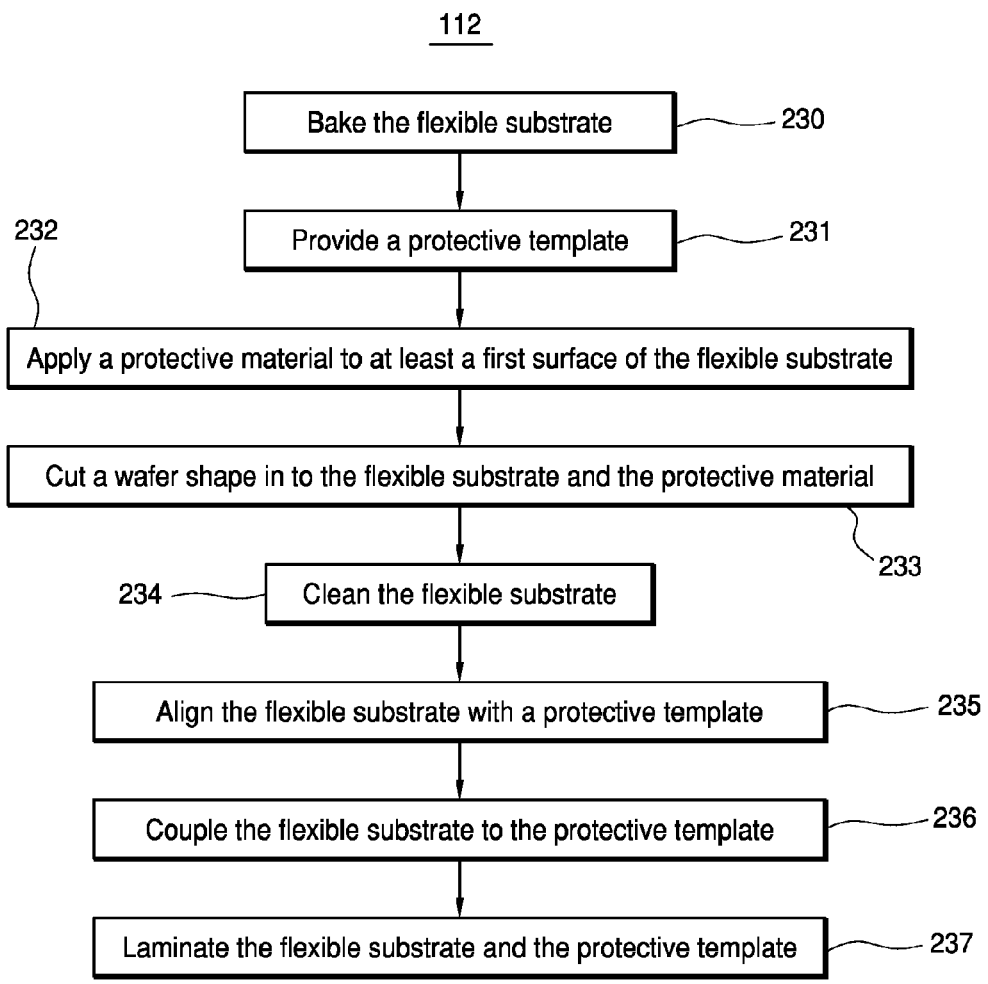
FIG. 2 is a flow chart illustrating a procedure of preparing the flexible substrate, according to the first embodiment.

Method 100 of FIG. 1 continues with procedure 112 of preparing the flexible substrate. FIG. 2 is a flow chart illustrating procedure 112 of preparing the flexible substrate, according to the first embodiment.

Procedure 112 of FIG. 2 can include a process 230 of baking the flexible substrate. Baking the flexible substrate can help release oligomers and other chemicals in the flexible substrate that could potentially leach out later during method 100 (FIG. 1).

In some examples, the flexible substrate can be baked using a vacuum bake process. For example, the temperature in an oven containing the flexible substrate can be ramped up over approximately two to three hours to approximately 160 degrees Celsius (° C.) to approximately 200° C. The flexible substrate can be baked for one hour at approximately 160° C. to approximately 200° C. and at a pressure of approximately one to approximately ten milliTorr. Then, the temperature in the oven can be lowered to between approximately 90° C. to approximately 115° C., and the flexible substrate can be baked for approximately eight more hours. Other baking processes can be also be used. After the baking process is complete, the plastic substrate can be wiped clean of any residues or chemicals that were baked off Subsequently, procedure 112 of FIG. 2 includes a process 231 of providing a protective template. The protective template can act as both a guide for the placement of the flexible substrate as well as a protective layer between the flexible substrate and the rollers and/or handling mechanisms of various processing equipment. In some examples, the protective template is a sheet of Mylar or any inexpensive plastic.

The protective template can be 5 mm (millimeters) to 15 mm thick and cut to a length of approximately 0.5 m (meters) to approximately 1.5 m. In other embodiments, the protective template can be 50 micrometers to 15 mm thick and cut to a length of approximately 0.5 m (meters) to approximately 1.5 m. In various embodiments, as part of process 231, the protective template is folded in half and run through rollers (e.g., a hot roll laminator) to help lock in the fold. A line trace of a carrier substrate can also be made on the back side of the protective sheet as part of process 231. Additionally, the protective template can be baked at approximately 90° C. to approximately 110° C. for approximately five minutes to approximately ten minutes to help flatten the protective template.

Procedure 112 of FIG. 2 continues with a process 232 of applying a protective material to at least a portion of a first surface of the flexible substrate. In some embodiments, a protective material can be applied over at least a portion of a planarized surface of the flexible substrate. In some examples, the protective material is not applied to a portion of the flexible substrate.

The protective material prevents scratches and adhesive from covering the planarized surface of the flexible substrate and, thus, reduces defects. In some examples, blue low tack tape (e.g., from Semiconductor Equipment Corporation, part number 18133-7.50) or Mylar could be used as the protective material. The protective material can be approximately 25 micrometers to approximately 100 micrometers thick. For example, the protective material can be approximately 70 micrometers thick. In some examples, the protective material is applied by rolling the protective material onto the planarized surface of the flexible substrate using a roller to remove air bubbles between the protective material and the flexible substrate.

Subsequently, procedure 112 of FIG. 2 includes a process 233 of cutting the flexible substrate and protective material into the shape of a wafer. A punch cut template can be used to press the wafer shape into the flexible substrate (with the planarized side, if any, up) and/or the protective material. In one embodiment, the punch cut template is used to create a temporary or permanent impression in the protective material and the flexible substrate at the same time.

If the pressing of the punch cut template cuts completely through the flexible substrate, the flexible substrate is scrapped because the press cut can create cracks in a coating on the flexible substrate that propagate throughout the flexible substrate. After the wafer shape is outlined into the flexible substrate and/or the protective material using the press, the flexible substrate and the protective material are cut simultaneously with each other. In some examples, the flexible substrate and protective material are cut using ceramic scissors approximately one millimeter outside the impression made by the punch cut template.

Figure 3:
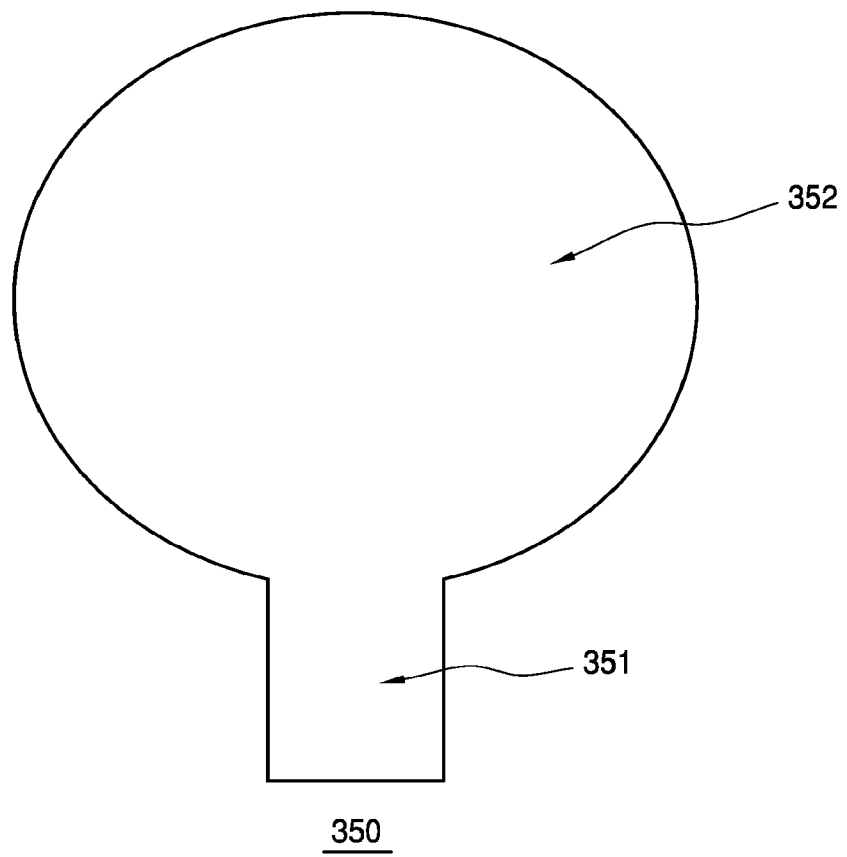
FIG. 3 illustrates a top view of the flexible substrate, according to the first embodiment.

In some examples, the flexible substrate includes a tab extending from the wafer shape in the flexible substrate and the protective material. The tab can be used to help align the flexible substrate to a carrier substrate when traveling through a laminator in procedure 117 of FIG. 1. FIG. 3 illustrates a top view of a flexible substrate 350, according to a first embodiment. Flexible substrate 350 can include a body 352 and a tab 351. In many examples, body 352 can have a circular shape. Although not illustrated in FIG. 3, the protective material is located over flexible substrate 350 also includes a similarly shaped tab. In one embodiment, the tab is not part of the punch cut template and is cut freehand or freestyle into the flexible substrate and the protective material.

Referring back to FIG. 2, procedure 112 of FIG. 2 continues with a process 234 of cleaning the flexible substrate. In some examples, the second or non-planarized side of the flexible substrate (i.e., the side without the protective material) is dry wiped to remove any oligomers, other chemicals, or particles. Afterwards, the planarized side of the flexible substrate having the protective material is blown clean with a nitrogen gun. In other examples, both sides of are dry wiped and/or blown clean.

Next, procedure 112 of FIG. 2 includes a process 235 of aligning the flexible substrate with a protective template. In some examples, the flexible substrate having the wafer shape with the tab is aligned with the line trace of a carrier substrate drawn or made on the protective template in process 231. The line trace of the carrier substrate is typically slightly larger than the wafer shape of the flexible substrate.

Subsequently, procedure 112 of FIG. 2 includes a process 236 of coupling the flexible substrate to the protective template. In some embodiments, the flexible substrate is attached to the protective template by attaching a portion of the tab of the flexible substrate to the protective template. For example, a piece of double-sided tape can couple the tab of the flexible substrate to the protective template. In some examples, a portion of the protective material is peeled off of and removed from the tab, and the double-sided tape is coupled to the exposed portion of the tab of the flexible substrate. In some examples, the portion of the protective material can be peeled using tweezers and can be cut from the protective template using a pair of ceramic scissors. In other examples, in procedure 232 of FIG. 2, the protective material is not applied to the portion the tab to which the double-sided tape will be attached so peeling and removal of a portion of the protective material is not necessary.

Figure 4:
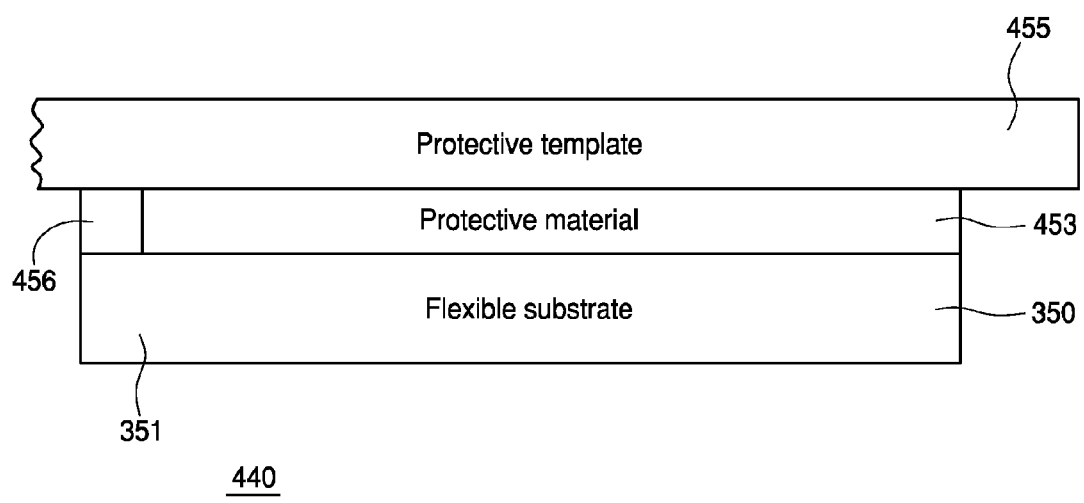
FIG. 4 illustrates a partial cross-sectional view of a flexible substrate assembly after attaching the flexible substrate of FIG. 3 to a protective template, according to the first embodiment.

After coupling the flexible substrate to the protective coating, the protective template is then folded over the flexible substrate. FIG. 4 illustrates a partial cross-sectional view of a flexible substrate assembly 440 after attaching flexible substrate 350 to a protective template 455, according to the first embodiment. In this example, a tape 456 is coupled to flexible substrate 350 and protective template 455. A protective material 453 is coupled to flexible substrate 350, as described previously.

In some examples, only one side of the flexible substrate is attached to the protective template. In other examples, both sides of the flexible substrate are attached to the protective template.

Next, procedure 112 of FIG. 2 includes a process 237 of laminating the flexible substrate, the protective material, and the protective template. The flexible substrate and the protective material are located between the two folded halves of the protective template. The flexible substrate, the protective material, and the protective template can be laminated using a hot roll laminator to remove air bubbles between the protective material and the protective template and also between the protective material and the flexible substrate. In some examples, the flexible substrate and the protective template are placed over a guide sheet (e.g., a Lexan® guide sheet) and fed into the hot roll laminator. As an example, the tab of the flexible substrate and the protective material can be fed first into the laminator. The flexible substrate and the protective template are laminated at a pressure of approximately 120 kPa (kilopascals) to approximately 160 kPa and at a temperature of approximately 90° C. to approximately 110° C. The lamination speed can be approximately one meter per minute to approximately two meters per minute.

After laminating the flexible substrate and protective template, procedure 112 is complete. Referring back to FIG. 1, method 100 of FIG. 1 includes a procedure 113 of providing a carrier substrate. In many embodiments, the carrier substrate can be a 6, 8, 12, or 18 inch wafer or panel. In some embodiments the carrier substrate can be a panel of approximately 370 mm by 470 mm.

The carrier substrate can include a first surface and a second surface opposite the first surface. In some examples, at least one of the first surface and the second surface has been polished. Polishing the surface that is not subsequently coupled to the flexible substrate improves the ability of a vacuum or air chuck to handle the carrier substrate. Also, polishing the surface that is subsequently coupled to the flexible substrate removes topological features of the surface of the carrier substrate that could cause roughness of the flexible substrate assembly in the z-axis after the coupling with the flexible substrate.

In various embodiments, the carrier substrate comprises at least one of the following: alumina ($Al_2O_3$), silicon, low CTE glass, steel, sapphire, barium borosilicate, soda lime silicate, an alkali silicate, or another material that is CTE matched to the flexible substrate. The CTE of the carrier substrate should be matched to the CTE of the flexible substrate. Non-matched CTEs can create stress between the carrier substrate and the flexible substrate.

For example, the carrier substrate could comprise sapphire with a thickness between approximately 0.7 mm and approximately 1.1 mm. The carrier substrate could also comprise 96% alumina with a thickness between approximately 0.7 mm and approximately 1.1 mm. In a different embodiment, the thickness of the 96% alumina is approximately 2.0 mm. In another example, the carrier substrate could be a single crystal silicon wafer with a thickness of at least approximately 0.65 mm. In still a further embodiment, the carrier substrate could comprise stainless steel with a thickness of at least approximately 0.5 mm. In some examples, the carrier substrate is slightly larger than the flexible substrate.

Next, method 100 of FIG. 1 includes a procedure 114 of providing a cross-linking adhesive. In some examples, the cross-linking adhesive outgases at a rate of less than approximately $2\times10^{-4}$ Torr-liters per second. In some examples, the cross-linking adhesive is thermally and/or UV (ultraviolet) light curable.

In various embodiments, the cross-linking adhesive is a cross-linking acrylic adhesive. In the same or different embodiment, the cross-linking adhesive is a cross-linking pressure sensitive acrylic adhesive or a cross-linking viscoelastic polymer. In some examples, the CTE of the adhesive is very large compared to the CTE of the flexible substrate and the carrier substrate. However, the CTE of the adhesive is not important because the adhesive does not create any stress (i.e., viscoelasticity) between the flexible substrate and carrier substrate because the layer of adhesive is so thin compared to the thickness of the flexible substrate and carrier substrate.

Subsequently, method 100 of FIG. 1 includes a procedure 116 of depositing the cross-linking adhesive over a first surface of the carrier substrate. In many embodiments, depositing the cross-linking adhesive over a first surface of the carrier substrate can be performed using at least one of the following methods: spin-coating, spray-coating, extrusion coating, preform lamination, slot die coating, screen lamination, and screen printing.

For example, the carrier substrate can be coated with the cross-linking adhesive.

The carrier substrate and the cross-linking adhesive can be spun to distribute the cross-linking adhesive over a first surface of the carrier substrate. In some embodiments, the cross-linking adhesive is spin coated on the carrier substrate by spinning the carrier substrate with the cross-linking adhesive at approximately 900 rpm (revolutions per minute) to 1100 rpm for approximately 20 seconds to approximately 30 seconds and then spinning the carrier substrate with the cross-linking adhesive at approximately 3400 rpm to approximately 3600 rpm for approximately 10 seconds to 30 seconds. In a different embodiment, the carrier substrate with the cross-linking adhesive is spun at approximately 600 rpm to approximately 700 rpm to coat the surface of the carrier substrate and then spun at approximately 3400 rpm to approximately 3600 rpm to control the thickness of the cross-linking adhesive.

Prior to spin coating, the cross-linking adhesive can be dispensed onto or over a geometric center of the carrier substrate. In a different embodiment, the cross-linking adhesive can be dispensed onto or over the carrier substrate while the carrier substrate is spinning.

The thickness of the cross-linking adhesive over the carrier substrate after the depositing procedure can be between approximately five micrometers and approximately fifteen micrometers. In another embodiment, the thickness of the cross-linking adhesive over the carrier substrate after the depositing procedure can be between approximately three micrometers and approximately fifteen micrometers. In the same or different embodiment, the thickness of the cross-linking adhesive over the carrier substrate after the depositing procedure can be between approximately ten micrometers and approximately twelve micrometers.

Method 100 of FIG. 1 continues with a procedure 116 of baking the cross-linking adhesive. In some embodiments, the cross-linking adhesive can be baked to remove solvents. For example, the cross-linking adhesive can be baked at 80° C. for thirty minutes and then baked for fifteen minutes at 130° C.

In other examples, the cross-linking adhesive is not baked. For example, if the cross-linking adhesive does not include any solvents, a bake is not necessary. Moreover, if the cross-linking adhesive is very viscous, solvents may even be added to the cross-linking adhesive to decrease the viscosity before the adhesive is deposited in procedure 115.

Figure 5:
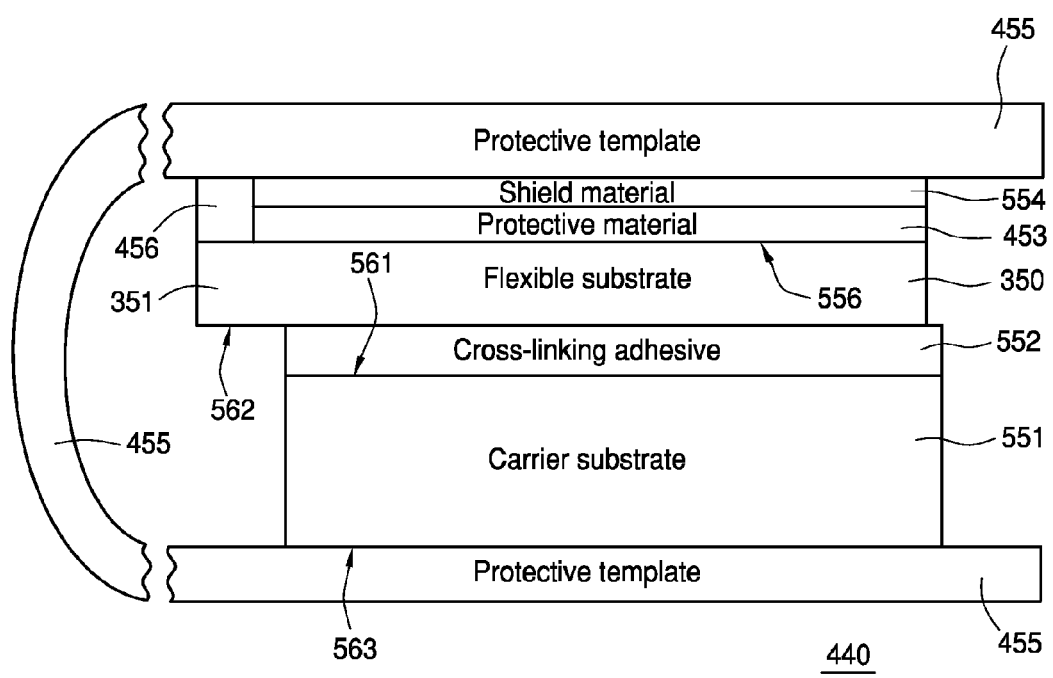
FIG. 5 illustrates a partial cross-sectional view of the flexible substrate assembly of FIG. 4 after coupling a carrier substrate to the flexible substrate assembly, according to the first embodiment.

Afterwards, the carrier substrate can be placed on the protective template. The flexible substrate is already coupled to one portion (or half) of the protective template as shown in FIG. 5, and the carrier substrate with cross-linking adhesive can be placed on another portion (or half) of the protective template. In some examples, the cross-linking adhesive is still in liquid form at this point. Thus, the carrier substrate coated with the cross-linking adhesive can be stored horizontally for approximately eight to approximately twelve hours before being coupled with the flexible substrate.

Next, method 100 of FIG. 1 includes a procedure 117 of coupling the carrier substrate to the flexible substrate using the cross-linking adhesive while both substrates are located between the protective template halves. The second surface of the flexible substrate can be placed over the first surface of the carrier substrate with the adhesive located between the second surface of the flexible substrate and the first surface of the carrier substrate.

In some examples, the carrier substrate is coupled to the flexible substrate using the cross-linking adhesive by laminating the flexible substrate assembly between the protective template halves to remove air bubbles between the carrier substrate and the flexible substrate. Laminating the flexible substrate involves first aligning the carrier substrate with the flexible substrate so that, when laminated, the carrier substrate and the flexible substrate are aligned. Then, the aligned structure can be fed through a hot roll laminator, which can be the same laminator of process 237 of FIG. 2. The flexible substrate assembly can be laminated at an approximate speed of 0.4 to 0.6 meters per minute.

Also, in various embodiments, the protective material may stick to the protective template when laminated. To avoid this problem, a shield material can be located between the protective template and the protective material before the lamination of process 237 and/or process 232. The shield material can be, for example, wax paper. In one embodiment, the shield material is originally coupled to the protective material when acquired from the manufacturer.

In the same or different embodiments, some of the cross-linking adhesive can be squeezed out from between the carrier and flexible substrates during lamination and adhere to the first side or the top of the flexible substrate, particularly because the carrier substrate and the overlying cross-linking adhesive layer is slightly larger than the flexible substrate. The presence of the protective material, however, prevents this problem from occurring. The cross-linking adhesive that squeezes out and adheres to the top of the protective material (instead of the flexible substrate) is inconsequential because the protective material is eventually removed and discarded.

FIG. 5 illustrates a partial cross-sectional view of flexible substrate assembly 440 after coupling a carrier substrate 551 to flexible substrate assembly 440, according to the first embodiment. In this embodiment, a cross-linking adhesive 552 couples a surface 561 of carrier substrate 551 to a surface 562 of flexible substrate 350. Protective material 453 is located over a surface 556 of flexible substrate 350. A shield material 554 is located between protective material 453 and protective template 455. Protective template 455 is folded such that protective template 455 is also located under a surface 563 of carrier substrate 551. Tape 456 couples protective template 455 to flexible substrate 456.

Figure 6:
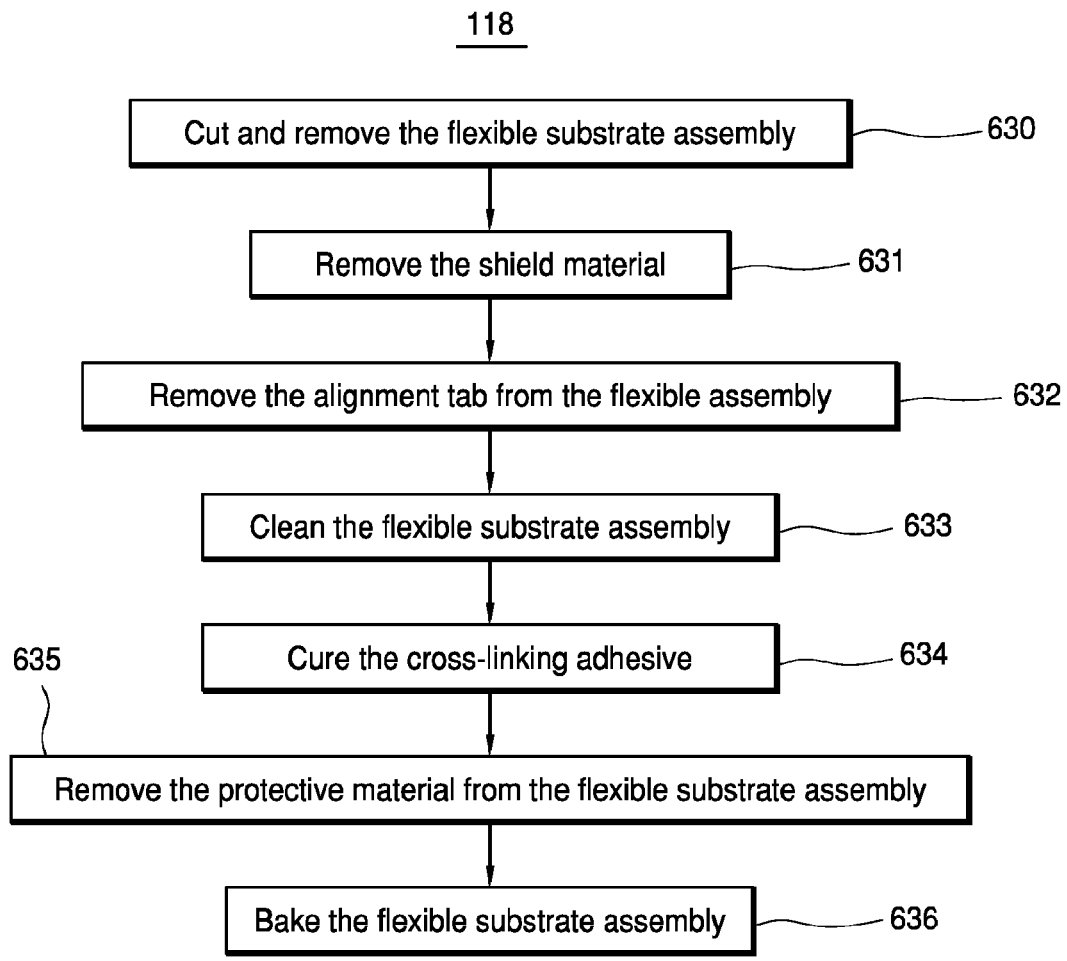
FIG. 6 is a flow chart illustrating a procedure of processing the flexible substrate assembly of FIG. 4, according to the first embodiment.

Referring again back to FIG. 1, method 100 continues with a procedure 118 of processing the flexible substrate assembly. FIG. 6 is a flow chart illustrating procedure 118 of processing the flexible substrate assembly, according to the first embodiment.

Figure 7:
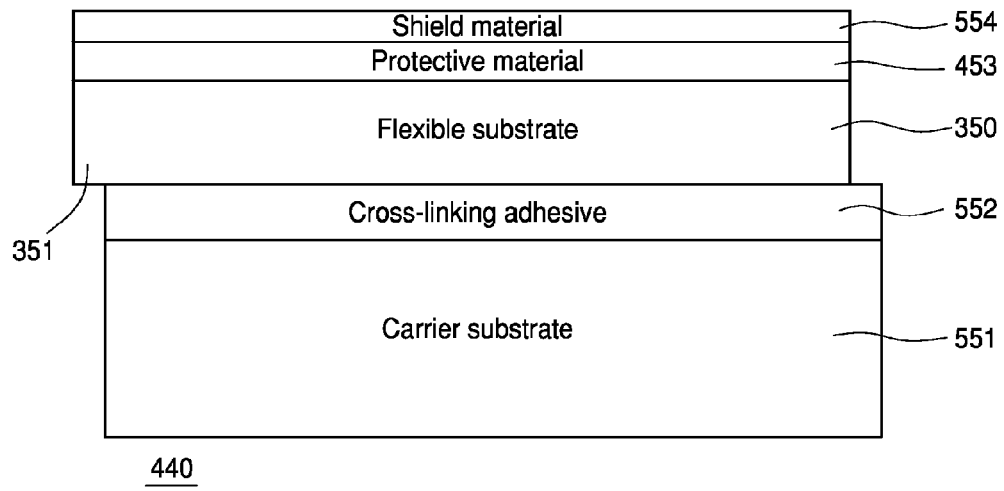
FIG. 7 illustrates a cross-sectional view of the flexible substrate assembly of FIG. 4 after cutting the flexible substrate assembly, according to the first embodiment.

Procedure 118 of FIG. 6 includes a process 630 of cutting the flexible substrate assembly. In some examples, a pair of ceramic scissors is used to cut the protective template and across the alignment tab of the flexible substrate located between the protective template, but the alignment tab is not removed entirely. After cutting the flexible substrate assembly, the protective template can be peeled away from or otherwise removed from the shield material and the carrier substrate by hand. FIG. 7 illustrates a cross-sectional view of flexible substrate assembly 440 after cutting the flexible substrate assembly and removing the protective template, according to the first embodiment. More specifically, in FIG. 7, protective template 455 (FIGS. 4 & 5), tape 456 (FIGS. 4 & 5), and tab 351 of flexible substrate 350 have been removed.

Referring again to FIG. 6, the next process in procedure 118 is a process 631 of removing the shield material by hand. In some examples, the flexible substrate assembly is placed at an edge of a table with the shield material facing the table. The flexible substrate assembly is slowly moved off the table while the shield layer is removed (e.g., peeled) from the flexible substrate assembly. That is, the shield layer can be removed by pulling the shield material downward away from the edge of the table while the flexible substrate assembly is moved horizontally off the table. In some examples, if the flexible substrate is not properly centered on or otherwise aligned with the carrier substrate after removing the shield layer, the plastic substrate can be slid into alignment with the carrier substrate.

Figure 8:
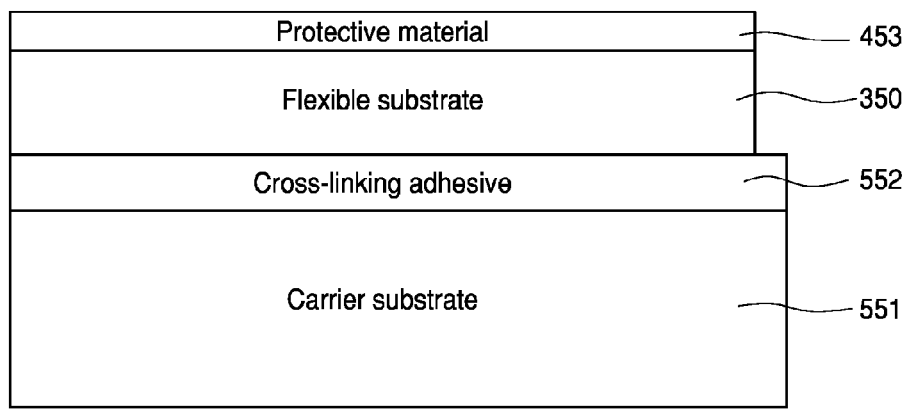
FIG. 8 illustrates a cross-sectional view of the flexible substrate assembly of FIG. 4 after removing an alignment tab, according to the first embodiment.

Subsequently, procedure 118 of FIG. 6 includes a process 632 of removing the alignment tab from the flexible assembly. In some examples, the alignment tab can be cut from the flexible substrate using ceramic scissors. The cut should be made slowly as any movement of the flexible substrate in the z-direction (relative to the carrier substrate) might cause de-lamination of the flexible substrate from the carrier substrate. If de-lamination occurs, the flexible substrate assembly can be re-laminated. FIG. 8 illustrates a cross-sectional view of flexible substrate assembly 440 after removing the alignment tab, according to the first embodiment.

Next, procedure 118 of FIG. 6 includes a process 633 of cleaning the flexible substrate assembly. In some examples, the flexible substrate assembly is cleaned with hexanes. The hexanes can be applied by spinning the flexible substrate assembly and spraying the hexanes on the protective material. After the protective material is cleaned, the exposed surface and edge of the carrier substrate is wiped clean with hexanes.

Procedure 118 of FIG. 6 continues with a process 634 of curing the cross-linking adhesive. In the same or different embodiment, the cross-linking adhesive is UV cured. For example, the flexible substrate assembly can be exposed to UV light for approximately 15 to 25 seconds and room temperature to cure the cross-linking adhesive. In some embodiments, the cross-linking adhesive can be cured with UV light in the UV light range of approximately 320 nm (nanometers) to approximately 390 nm and with an intensity of approximately 75 mW/cm2 (milliWatts per square centimeter). A Dymax 2000-EC UV Curing Flood Lamp, manufactured by Dymax Corporation of Torrington, Conn., can be used to cure the cross-linking adhesive.

In various examples, the cross-linking adhesive is thermally cured during the baking in process 636. In some examples, the edges of the cross-linking adhesive are UV cured, and the rest of the cross-linking adhesive is thermally cured during the baking of process 636.

Figure 9:
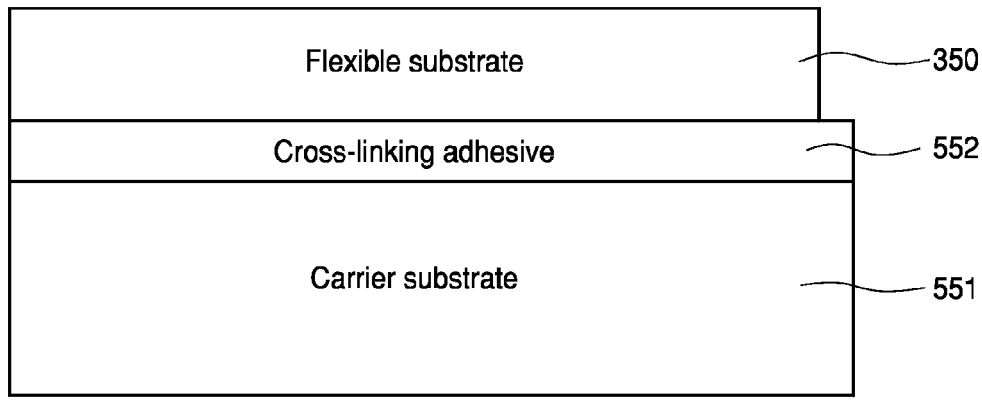
FIG. 9 illustrates a cross-sectional view of the flexible substrate assembly of FIG. 4 after removing a protective material from the flexible substrate assembly, according to the first embodiment.

Subsequently, procedure 118 of FIG. 6 includes a process 635 of removing the protective material from the flexible substrate assembly. In some examples, the protective material can be slowly removed using tweezers. During the removal process, the protective material is kept as flat as possible to avoid de-laminating the flexible substrate from the carrier substrate. In other examples, the protective material can be releasable by UV light. In these examples, the protective material would lose its tack during a UV light exposure. FIG. 9 illustrates a cross-sectional view of flexible substrate assembly 440 after removing the protective material from the flexible substrate assembly, according to the first embodiment.

Next, procedure 118 of FIG. 6 includes a process 636 of baking the flexible substrate assembly. Baking the flexible substrate assembly can help decrease the distortion, bow, and warp in the flexible substrate. In some embodiments, baking can also cure the adhesive.

In some examples, the flexible substrate assembly can be baked using a vacuum bake process. For example, the temperature in an oven containing the flexible substrate assembly can be ramped up over two to three hours to approximately 160° C. to approximately 190° C. The flexible substrate assembly can be baked for approximately 50 minutes to 70 minutes at 180° C. and with a pressure of approximately 1 millitorr to approximately 10 millitorr. The temperature in the oven can then be lowered to between approximately 90° C. to 115° C., and the flexible substrate assembly can be baked for approximately seven more hours to approximately nine more hours. Other baking processes can be also be used. After the baking process is complete, the flexible substrate assemblies are cleaned and placed in an oven at approximately 90° C. to 110° C. for a minimum of approximately two hours.

After baking the flexible substrate assembly, procedure 118 is complete. Referring again back to FIG. 1, method 100 includes a procedure 119 of fabricating one or more electrical components over a surface of the flexible substrate. In some examples, one or more active devices (e.g., transistors) and passive devices (e.g., resistors) can be formed over the first surface of the flexible substrate. In the same or different embodiment, the one or more electrical components fabricated over the flexible substrate can include one or more thin film transistors, organic light emitting diodes, inorganic light emitting diodes, electrode arrays, field effect transistors, and/or passive structures.

Figure 10:
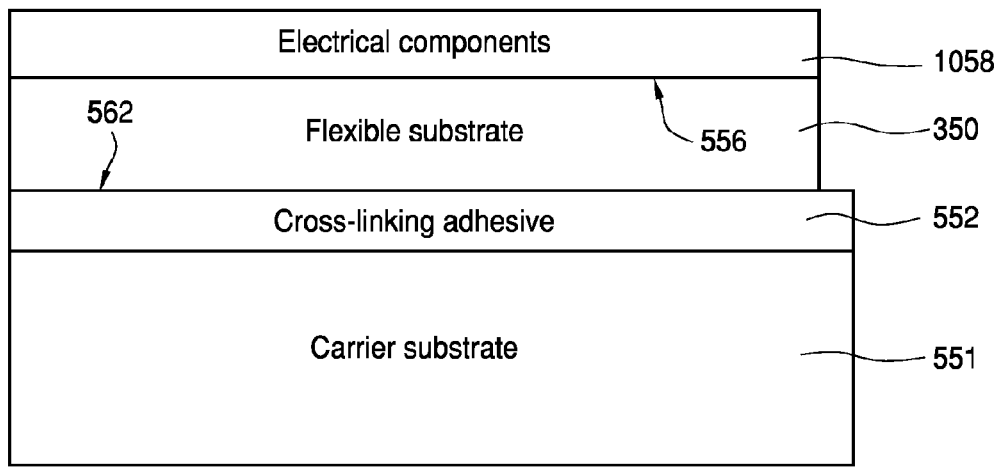
FIG. 10 illustrates a cross-sectional view of the flexible substrate assembly of FIG. 4 after fabricating one or more electrical components over the flexible substrate, according to the first embodiment.

FIG. 10 illustrates a cross-sectional view of flexible substrate assembly 440 after fabricating one or more electrical components 1058 over surface 556 of flexible substrate 350, according to the first embodiment.

Figure 11:
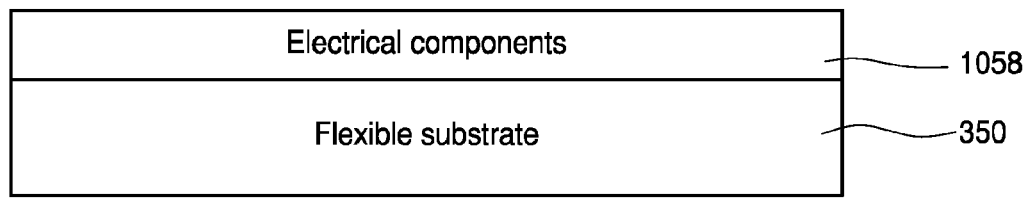
FIG. 11 illustrates a cross-sectional view of the flexible substrate assembly of FIG. 4 after removing the plastic substrate from the carrier substrate, according to the first embodiment.

Referring again to FIG. 1, method 100 of FIG. 1 continues with a procedure 120 of removing the flexible substrate from the carrier substrate. In some examples, the flexible substrate can be removed from the carrier substrate by peeling the plastic substrate from the carrier substrate by hand. FIG. 11 illustrates a cross-sectional view of flexible substrate assembly 440 after removing flexible substrate 350 from the carrier substrate, according to the first embodiment.

Method 100, as described herein, and similar methods can allow fabrication of one or more electrical components on a flexible substrate with zero or at least minimal distortion (e.g. less than or approximately the limits of the sensitivity of an Azores 5200, manufactured by Azores Corporation of Wilmington, Mass.). Prior art methods of fabricating electrical components on the flexible substrate suffer from significant distortion problems that can lead to handling errors, photolithographic alignment errors, and line/layer defects.

Although the invention has been described with reference to specific embodiments, it will be understood by those skilled in the art that various changes may be made without departing from the spirit or scope of the invention. For example, it will be readily apparent that additional baking and/or cleaning procedures can be added to method 100. Also, the manual procedures described herein can be performed by a machine and automated. Additional examples of such changes have been given in the foregoing description. Accordingly, the disclosure of embodiments is intended to be illustrative of the scope of the invention and is not intended to be limiting. It is intended that the scope of the invention shall be limited only to the extent required by the appended claims. To one of ordinary skill in the art, it will be readily apparent that the flexible substrate assembly and methods discussed herein may be implemented in a variety of embodiments, and that the foregoing discussion of certain of these embodiments does not necessarily represent a complete description of all possible embodiments. Rather, the detailed description of the drawings, and the drawings themselves, disclose at least one preferred embodiment, and may disclose alternative embodiments.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method comprising:
   providing a carrier substrate;
   providing a cross-linking adhesive;
   providing a plastic substrate;
   providing a protective template;
   attaching a protective material to at least a first surface of the plastic substrate;
   coupling the protective template to the plastic substrate such that the protective material is at least partially located between the protective template and the plastic substrate;
   after attaching the protective material to the at least the first surface of the plastic substrate, coupling the carrier substrate to a second surface of the plastic substrate using the cross-linking adhesive.

2. The method of claim 1 wherein:
   coupling the carrier substrate to the second surface of the plastic substrate comprises:
      depositing the cross-linking adhesive over a first surface of the carrier substrate;
      spinning the carrier substrate and the cross-linking adhesive to distribute the cross-linking adhesive over the first surface of the carrier substrate; and
      placing the plastic substrate over the first surface of the carrier substrate with the cross-linking adhesive located between the second surface of the plastic substrate and the first surface of the carrier substrate.

3. The method of claim 1 wherein:
   coupling the carrier substrate to the second surface of the plastic substrate comprises depositing the cross-linking adhesive over a first surface of the carrier substrate using at least one of the following techniques: spin-coating, spray-coating, extrusion coating, preform lamination, slot die coating, or screen lamination.

4. The method of claim 1 further comprising:
   after coupling the carrier substrate to the second surface of the plastic substrate, removing the plastic substrate from the carrier substrate.

5. The method of claim 1 further comprising:
after coupling the carrier substrate to the second surface of the plastic substrate, fabricating one or more electrical components over the first surface of the plastic substrate.

6. The method of claim 5, further comprising:
after fabricating the one or more electrical components, removing the plastic substrate from the carrier substrate.

7. The method of claim 1 further comprising at least one of:
thermally curing the cross-linking adhesive after coupling the carrier substrate to the second surface of the plastic substrate;
curing the cross-linking adhesive with ultraviolet light after coupling the carrier substrate to the second surface of the plastic substrate;
baking the plastic substrate before coupling the carrier substrate to the second surface of the plastic substrate; or
baking the cross-linking adhesive before coupling the carrier substrate to the second surface of the plastic substrate.

8. The method of claim 1 further comprising:
providing a shield material between the protective template and the protective material.

9. The method of claim 8 further comprising:
laminating the carrier substrate, the cross-linking adhesive, the plastic substrate, the protective template, the protective material, and the shield material.

10. The method of claim 1 wherein at least one of:
providing the carrier substrate comprises providing the carrier substrate with at least a polished first surface;
providing the carrier substrate comprises providing the carrier substrate comprising at least one of the following: alumina, silicon, stainless steel, or sapphire;
or
providing the carrier substrate comprises providing the carrier substrate comprising a material that is CTE matched to the plastic substrate.

11. The method of claim 1 wherein at least one of:
providing the plastic substrate comprises providing the plastic substrate comprising of at least one of the following: polyethylene naphthalate, polyethylene terephthalate, polyethersulfone, polyimide, polycarbonate, cyclic olefin copolymer, or liquid crystal polymer;
or
providing the plastic substrate comprises providing the plastic substrate with an elastic modulus of less than approximately five GigaPascals.

12. The method of claim 1 wherein at least one of:
providing the cross-linking adhesive comprises providing a cross-linking acrylic adhesive;
or
providing the cross-linking adhesive comprises providing a cross-linking adhesive that outgases at a rate of less than $2 \times 10^{-4}$ Torr-liters per second.

13. The method of claim 1 wherein:
providing the protective template comprises providing the protective template to be greater than or equal to 50 micrometers thick and less than or equal to 15 millimeters thick.

14. The method of claim 1 wherein:
providing the protective template comprises providing the protective template comprising plastic.

15. The method of claim 1 wherein:
providing the protective template comprises baking the protective template at a temperature of approximately 90° C. to approximately 110° C.

16. A method comprising:
providing a flexible plastic substrate having a first surface and a second surface opposite the first surface;
attaching a protective material to the first surface of the flexible plastic substrate;
providing a support substrate with a first surface and a polished second surface opposite the first surface;
providing a protective template;
coupling the protective template to the flexible plastic substrate such that the protective material is at least partially located between the protective template and the flexible plastic substrate;
providing a cross-linking acrylic adhesive; and
after attaching the protective material to the first surface of the flexible plastic substrate, coupling the first surface of the support substrate to the second surface of the flexible plastic substrate, wherein coupling the first surface of the support substrate to the second surface of the flexible plastic substrate comprises:
spin-coating the cross-linking acrylic adhesive across the first surface of the support substrate;
using the cross-linking acrylic adhesive to removably couple the first surface of the support substrate to the second surface of the flexible plastic substrate; and
laminating the support substrate and the flexible plastic substrate with the cross-linking acrylic adhesive located between the support substrate and the flexible plastic substrate.

17. The method of claim 16 further comprising:
after laminating, removing the protective material from the first surface of the flexible plastic substrate.

18. The method of claim 17 further comprising:
after removing the protective material, forming one or more transistors over the first surface of the flexible plastic substrate.

19. The method of claim 16 wherein:
providing the protective template comprises providing the protective template to be greater than or equal to 50 micrometers thick and less than or equal to 15 millimeters thick.

20. The method of claim 16 wherein:
providing the protective template comprises providing the protective template comprising plastic.

21. The method of claim 16 wherein:
providing the protective template comprises baking the protective template at a temperature of approximately 90° C. to approximately 110° C.

* * * * *